(12) United States Patent
Kim et al.

(10) Patent No.: US 6,987,290 B2
(45) Date of Patent: Jan. 17, 2006

(54) CURRENT-JUMP-CONTROL CIRCUIT INCLUDING ABRUPT METAL-INSULATOR PHASE TRANSITION DEVICE

(75) Inventors: Hyun Tak Kim, Daejeon (KR); Doo Hyeb Youn, Daejeon (KR); Kwang Yong Kang, Daejeon (KR); Byung Gyu Chae, Daejeon (KR); Yong Sik Lim, Chungcheongbuk-do (KR); Seong Hyun Kim, Daejeon (KR); Sungyul Maeng, Chungcheongbuk-do (KR); Gyungock Kim, Seoul (KR)

(73) Assignee: Electronics and Telecommunications Research Institute, (KR)

( * ) Notice: Subject to any disclaimer, the term of this patent is extended or adjusted under 35 U.S.C. 154(b) by 0 days.

(21) Appl. No.: 10/866,274

(22) Filed: Jun. 10, 2004

(65) Prior Publication Data

US 2005/0098836 A1    May 12, 2005

(30) Foreign Application Priority Data

Nov. 6, 2003  (KR) ...................... 10-2003-0078333

(51) Int. Cl.
*H01L 39/16*    (2006.01)

(52) U.S. Cl. ....................... 257/173; 257/174; 257/175

(58) Field of Classification Search ......... 257/173–175
See application file for complete search history.

(56) References Cited

U.S. PATENT DOCUMENTS 6,624,463 B2    9/2003    Kim et al.

*Primary Examiner*—Fetsum Abraham
(74) *Attorney, Agent, or Firm*—Blakely Sokoloff Taylor & Zafman

(57) ABSTRACT

A current-jump-control circuit including an abrupt metal-insulator phase transition device is proposed, and includes a source, the abrupt metal-insulator phase transition device and a resistive element. The abrupt metal-insulator phase transition device includes first and second electrodes connected to the source, and shows an abrupt metal-insulator phase transition characteristic of a current jump when an electric field is applied between the first electrode and the second electrode. The resistive element is connected between the source and the abrupt metal-insulator phase transition device to control a jump current flowing through the abrupt metal-insulator phase transition device. According to the above current control circuit, the abrupt metal-insulator phase transition device can be prevented from being failed due to a large amount of current and thus the current-jump-control circuit can be applied in various application fields.

9 Claims, 4 Drawing Sheets

CURRENT-JUMP-CONTROL CIRCUIT INCLUDING ABRUPT METAL-INSULATOR PHASE TRANSITION DEVICE

BACKGROUND OF THE INVENTION

This application claims the priority of Korean Patent Application No. 2003-78333, filed on Nov. 6, 2003, in the Korean Intellectual Property Office, the disclosure of which is incorporated herein in its entirety by reference.

1. Field of the Invention

The present invention relates to a current-jump-control circuit including an abrupt metal-insulator phase transition device.

2. Description of the Related Art

In recent years, instead of a metal oxide semiconductor field effect transistor (MOSFET) having a limitation in decreasing the channel length, a Mott field effect transistor (FET) has been proposed, which uses a Mott insulator as the channel layer. Since the Mott FET utilizes a metal-insulator phase transition that is successively generated, it is necessary to add electrons or holes to be used as a charge carrier until a metallic characteristic appears most well, which causes a limitation that the added charge should be in a high concentration state. Accordingly, a method using an insulator that shows an abrupt metal-insulator phase transition characteristic of a current jump under a constant condition has been recently proposed instead of an insulator showing a continuous metal-insulator phase transition, and is disclosed in U.S. Pat. No. 6,624,463. A field effect transistor disclosed in U.S. Pat. No. 6,624,463 shows an abrupt metal-insulator phase transition characteristic of a current jump induced by doping of a small hole concentration.

FIG. 1 is a graph showing electric field-current density characteristic of a current jump of a device manufactured using a material showing such an abrupt metal-insulator phase transition.

Referring to FIG. 1, when an electric field ($E_{field}$) of a predetermined level, for instance, of 7 MV/m is applied to both terminals of the device, the abrupt metal-insulator phase transition device is abruptly phase-transited from an insulator to a metal, so that a large amount of current flows through both terminals of the device. Thus, when a large current above a limitation current flows, the device may not endure against the large current and may be failed. Through the present specification, a device, which causes an abrupt metal-insulator phase transition when an electric field above a critical value is applied, is defined as "abrupt metal-insulator phase transition device."

As aforementioned, in the abrupt metal-insulator phase transition device, an abrupt metal-insulator phase transition may generate a large amount of current (current jump) abruptly. To this end, the abrupt metal-insulator phase transition device needs a control circuit that can control the current jump so as to endure this large amount of current.

SUMMARY OF THE INVENTION

The present invention provides a current jump control circuit including an abrupt metal-insulator phase transition device that can properly control a large amount of current flowing through the abrupt metal-insulator phase transition device to prevent the abrupt metal-insulator phase transition device from being failed.

According to an aspect of the present invention, there is provided a current control circuit including an abrupt metal-insulator phase transition device, comprising: a source; the abrupt metal-insulator phase transition device including first and second electrodes connected to the source, and showing an abrupt metal-insulator phase transition characteristic of a current jump when an electric field is applied between the first electrode and the second electrode; and a resistive element which is connected between the source and the abrupt metal-insulator phase transition device and is able to control a current jump flowing through the abrupt metal-insulator phase transition device.

The resistive element may be connected in series with the abrupt metal-insulator phase transition device.

The resistive element may be a resistor. In this case, the resistive element may be a variable resistor.

The resistive element may be a planar type device pattern that can be used as a resistor.

The resistive element may be an internal resistance material in the inhomogeneous phase-transition thin-film insulator that can be used as a resistor.

The abrupt metal-insulator phase transition device may have a structure that an insulator film having an abrupt metal-insulator phase transition characteristic is disposed between the first electrode and the second electrode. In this case, the insulator may comprise a vanadium oxide.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 2:
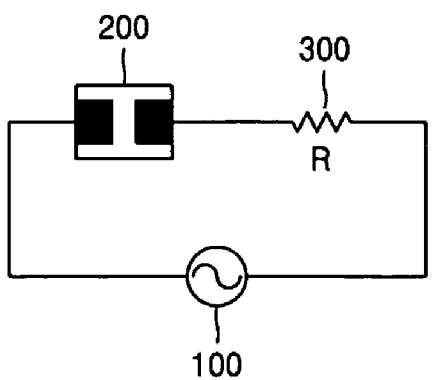
FIG. 2 is a diagram of a current control circuit including an abrupt metal-insulator phase transition device according to the present invention.

FIG. 2 is a diagram of a current control circuit including an abrupt metal-insulator phase transition device according to the present invention, and FIG. 3 is a sectional view of the abrupt metal-insulator phase transition device of FIG. 2.

Figure 3A:
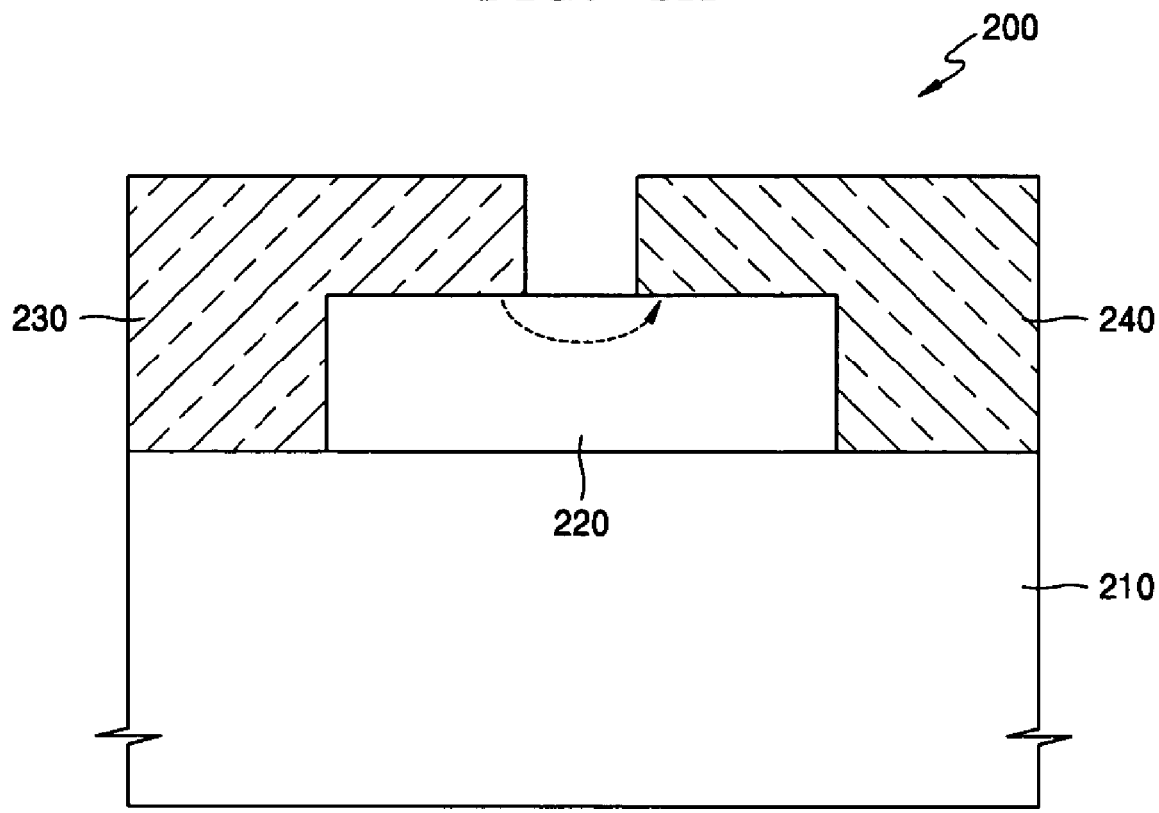
FIGS. 3A and 3B are several examples of a sectional view of the abrupt metal-insulator phase transition device of FIG. 2.
Figure 3B:
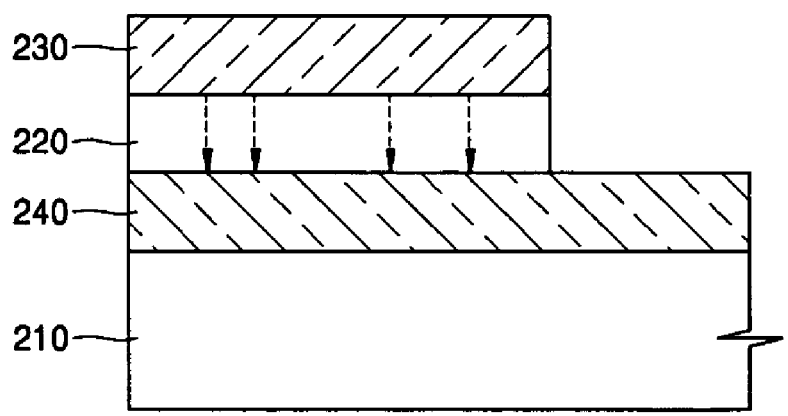

First referring to FIG. 2, a current control circuit according to the present invention includes a source 100, an abrupt metal-insulator phase transition device 200, and a resistive element 300. The source 100 may be a direct current (DC) source or an alternating current (AC) source. In the case of the DC source, a current flow in one direction, whereas in the AC source, a current flows in bi-directions. The abrupt metal-insulator phase transition device 200 is, as shown in FIG. 3A or 3B, provided with a thin film type insulator 220 having an abrupt metal-insulator phase transition characteristic of a current jump, and first and second electrodes 230 and 240 disposed at both sides of the thin film type insulator 220. The device 200 includes a substrate 210, which is made of sapphire ($Al_2O_3$) or silicon (Si). It will be apparent that the substrate 210 can be made of a material other than the aforementioned materials. The insulator 220 contains Vanadium dioxide ($VO_2$). The resistive element 300 is an element that can function as a controllable resistance, and includes a resistor representatively. In particular, the resistive element 300 may be a variable resistor that can control a resistance thereof with ease. Sometimes, the resistive element 300 may be a planar device pattern that can be used as a resistor. This planar device pattern has a property that its resistance is proportional to its length, and shows a resistance characteristic by connecting meander type transmission lines, various planar type inductors (AC resistances) and the like using the property of the planar device pattern. In this case, the resistance is controllable by adjusting the length of the transmission lines or the number of the planar type devices, etc. Sometimes, the resistive element 300 maybe an internal resistance material in the inhomogeneous phase-transition thin-film insulator.

An operation of the current control circuit constructed as above will be described.

When a predetermined electric field is applied to the first electrode 230 and the second electrode 240 of the abrupt metal-insulator phase transition device 200, the insulator 220 of the abrupt metal-insulator phase transition device 200 forms a current flow path (expressed by an arrow of a dotted line in FIG. 3) on a surface thereof while experiencing an abrupt metal-insulator phase transition phenomenon. Through the current flow path, a large amount of jump current flows from the first electrode 230 to the second electrode 240. At this time, the current amount is reduced, i.e., is controlled, by the resistive element 300, so that the current flows by such an amount that the abrupt metal-insulator phase transition device 200 is not failed.

Figure 4:
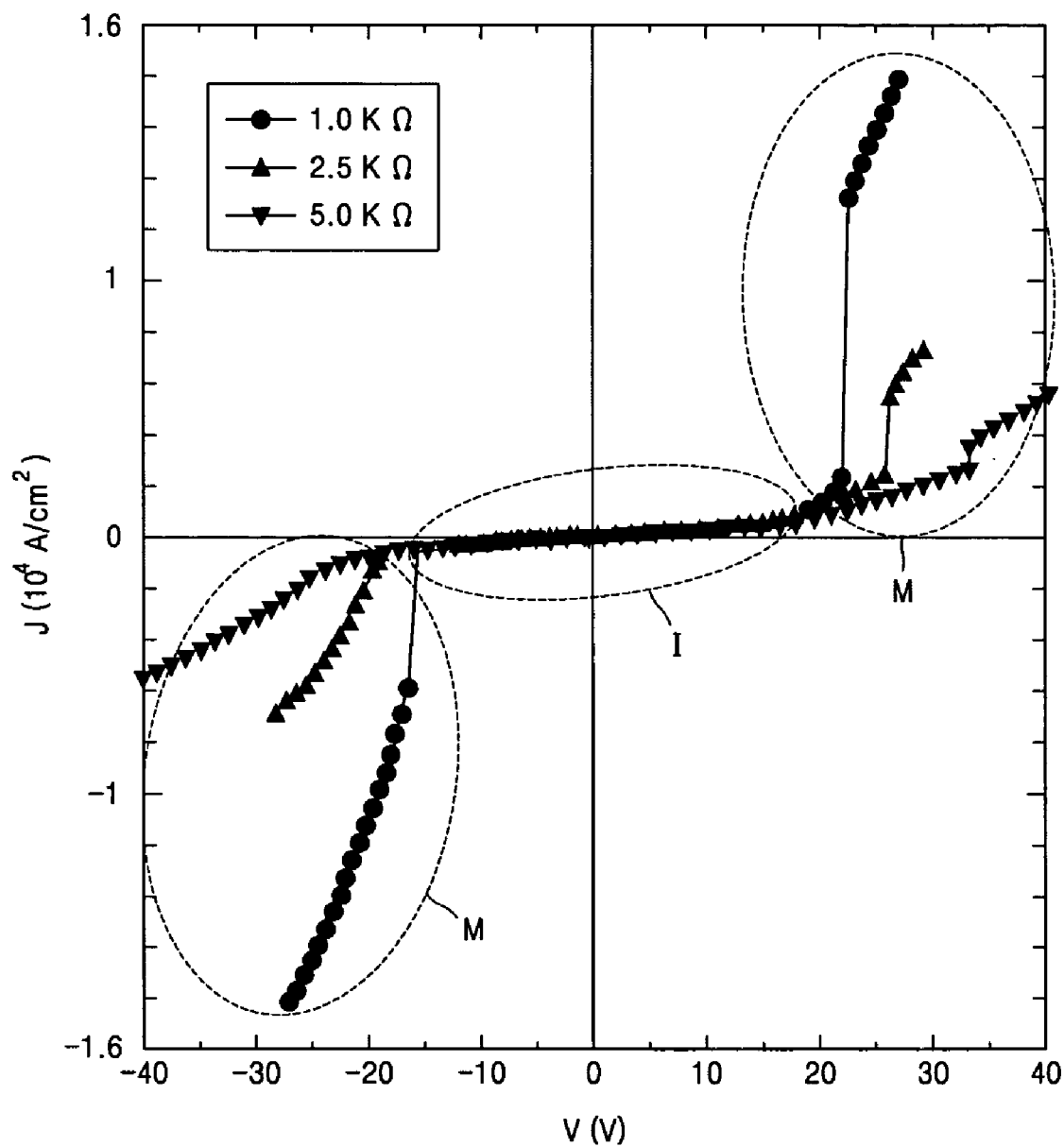
FIG. 4 is a graph showing the resistance dependence of the current jump of voltage-current density characteristic of a current control circuit including an abrupt metal-insulator phase transition device according to a first embodiment of the present invention.

FIG. 4 is a graph showing the resistance dependence of the current jump of voltage-current density characteristic of a current control circuit including an abrupt metal-insulator phase transition device according to a first embodiment of the present invention. In FIG. 4, a horizontal axis represents a voltage (V) applied between the first electrode 230 and the second electrode 240, and a vertical axis is a current density (J) between the first electrode 230 and the second electrode 240.

Figure 1:
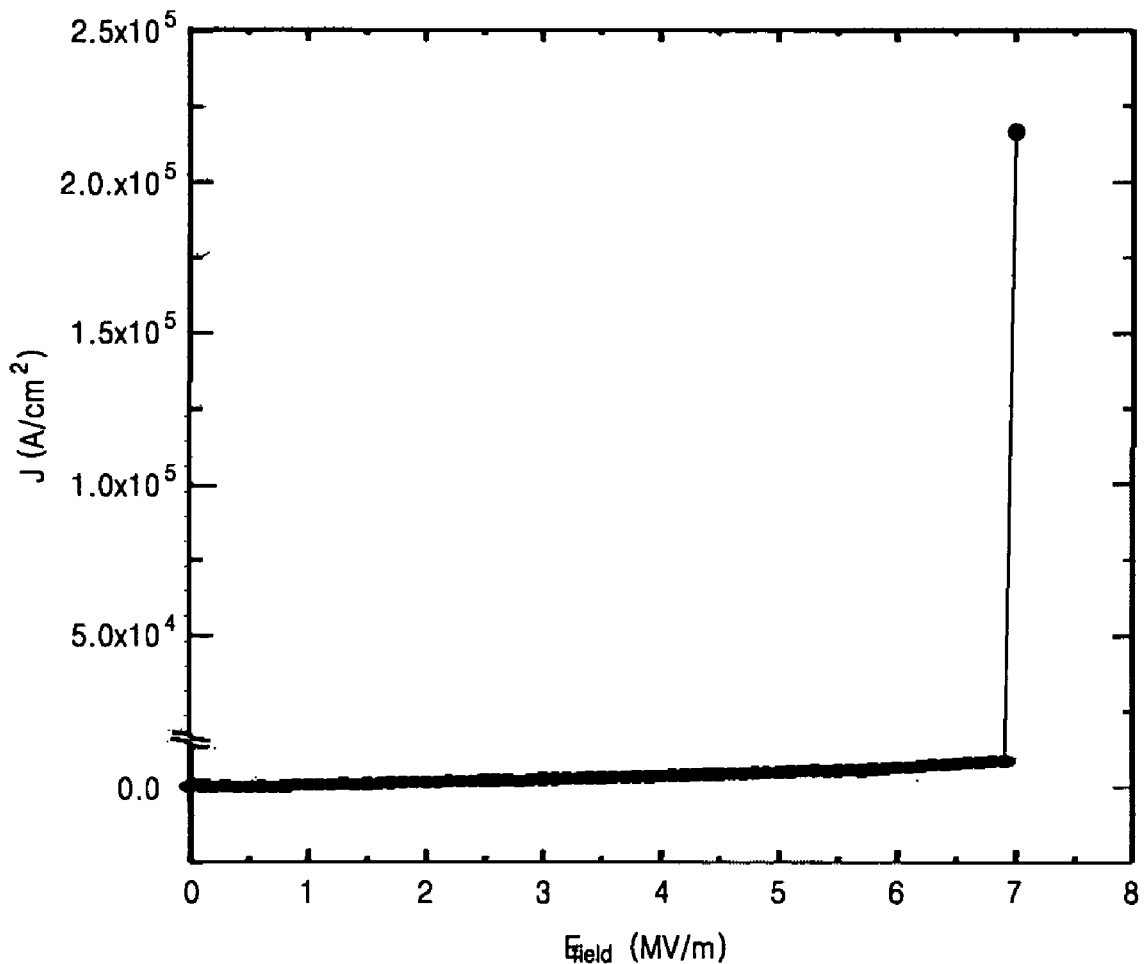
FIG. 1 is a graph showing electric field-current density characteristic of a current jump of a device manufactured using a material showing such an abrupt metal-insulator phase transition.

The abrupt metal-insulator phase transition device 200 used in the test of FIG. 4 is a device having the sapphire ($Al_2O_3$) substrate 210 and the vanadium dioxide ($VO_2$) insulator 220, and has a channel length of 5 $\mu$m between the first electrode 230 and the second electrode 240 and a channel width of 25 $\mu$m. In FIG. 4, a line indicated by a reference symbol '●' corresponds to a case that the resistance (R) of the resistive element 300 is 1.0 k$\Omega$, a line indicated by a reference symbol '▲' corresponds to a case that the resistance (R) of the resistive element is 2.5 k$\Omega$, and a line indicated by a reference symbol '▼' corresponds to a case that the resistance (R) of the resistive element 300 is 5.0 k$\Omega$. As will be seen from the graph of FIG. 4, when the abrupt metal-insulator phase transition device 200 is in an insulator state (expressed by 'I' in FIG. 4), there is not shown a difference in the current density although the resistances (R) of the resistive element 300 are different from one another, whereas, when the abrupt metal-insulator phase transition device 200 is in a metal state (expressed by 'M' in FIG. 4), it is shown that as the resistance (R) of the resistive element 300 increases, the current flowing through the abrupt metal-insulator phase transition device 200 decreases gently. When comparing this results with the case of FIG. 1, i.e., the case that the resistive element 300 does not exist, it can be easily known that the abrupt metal-insulator phase transition device 200 with the resistive element 300 can be prevented from being failed even by a large amount of current generated by the abrupt metal-insulator phase transition.

Figure 5:
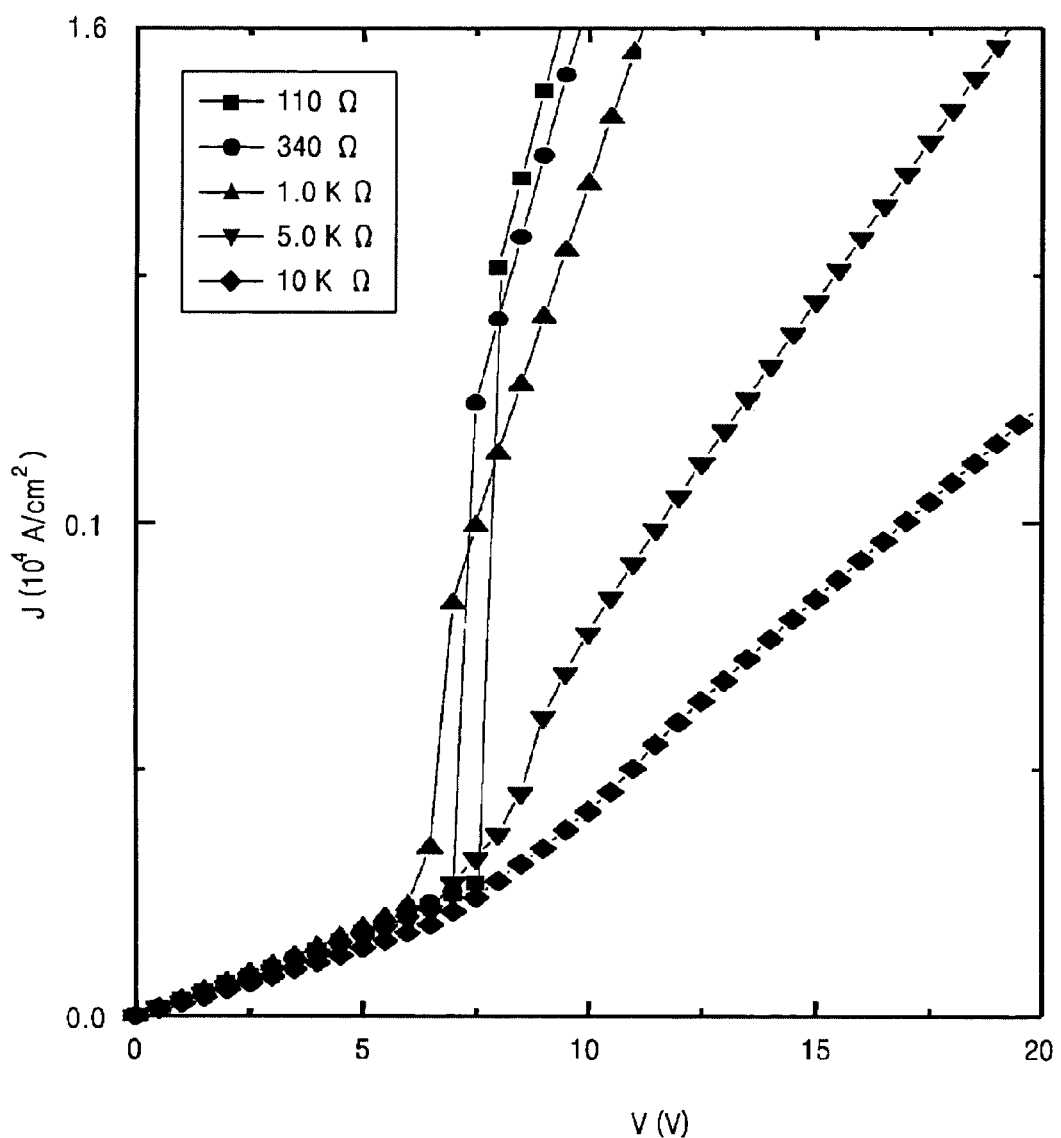
FIG. 5 is a graph showing the resistance dependence of the current jump of voltage-current density characteristic of a current control circuit including an abrupt metal-insulator phase transition device according to a second embodiment of the present invention.

FIG. 5 is a graph showing the resistance dependence of the current jump of voltage-current density characteristic of a current control circuit including an abrupt metal-insulator phase transition device according to a second embodiment of the present invention. In FIG. 5, a horizontal axis represents a voltage (V) applied between the first electrode 230 and the second electrode 240, and a vertical axis is a current density (J) between the first electrode 230 and the second electrode 240.

The abrupt metal-insulator phase transition device 200 used in the test of FIG. 5 is a device using the silicon (Si) substrate 210 and the vanadium dioxide ($VO_2$) insulator 220, and has a channel length of 5 $\mu$m between the first electrode 230 and the second electrode 240 and a channel width of 25 $\mu$m. In FIG. 5, a line indicated by a reference symbol '■' corresponds to a case that the resistance (R) of the resistive element 300 is 110 $\Omega$, a line indicated by a reference symbol '●' corresponds to a case that the resistance (R) of the resistive element 300 is 340 $\Omega$, a line indicated by a reference symbol '▲' corresponds to a case that the resistance (R) of the resistive element is 1.0 k$\Omega$, a line indicated by a reference symbol '▼' corresponds to a case that the resistance (R) of the resistive element 300 is 5.0 k$\Omega$, and a line indicated by a reference symbol '♦' corresponds to a case that the resistance (R) of the resistive element 300 is 10 k$\Omega$. As will be seen from the graph of FIG. 5, there is shown a tendency that as the resistance (R) of the resistive element 300 increases, the current flowing through the abrupt metal-insulator phase transition device 200 decreases gently.

As described previously, in a current control circuit including an abrupt metal-insulator phase transition device according to the present invention, although a large amount of current is generated due to an abrupt metal-insulator phase transition phenomenon, the resistive element connected in series to the abrupt metal-insulator phase transition device suppresses a magnitude of the current jump, so that the abrupt metal-insulator phase transition device can be prevented from being failed and thus the current control circuit can be applied in various application fields.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A current-jump-control circuit including an abrupt metal-insulator phase transition device, comprising
    a source;
    the abrupt metal-insulator phase transition device including first and second electrodes connected to the source, and showing an abrupt metal-insulator phase transition characteristic of a current jump when an electric field is applied between the first electrode and the second electrode; and a resistive element which is connected between the source and the abrupt metal-insulator phase transition device and is able to control a magnitude of a jump current flowing through the abrupt metal-insulator phase transition device.

2. The current control circuit of claim 1, wherein the resistive element is connected in series with the abrupt metal-insulator phase transition device.

3. The current control circuit of claim 1, wherein the resistive element is a resistor.

4. The current control circuit of claim 1, wherein the resistive element is an internal resistance material in the inhomogeneous phase-transition thin-film insulator.

5. The current control circuit of claim 3, wherein the resistive element is a variable resistor.

6. The current control circuit of claim 1, wherein the resistive element is a planar type device pattern that can be used as a resistor.

7. The current control circuit of claim 6, wherein the insulator comprises a vanadium oxide.

8. The current control circuit of claim 1, wherein the resistive element is an alternating current resistor (or impedance resistance) that can be used as a resistor.

9. The current control circuit of claim 1, wherein the abrupt metal-insulator phase transition device has a structure that an insulator film having an abrupt metal-insulator phase transition characteristic of a current jump is disposed between the first electrode and the second electrode.

* * * * *